US008269663B2

(12) United States Patent
Sotomaru

(10) Patent No.: US 8,269,663 B2
(45) Date of Patent: Sep. 18, 2012

(54) REMOTE CONTROL SYSTEM AND METHOD OF CONTROLLING THE REMOTE CONTROL SYSTEM

(75) Inventor: Toshihiro Sotomaru, Kiyose (JP)

(73) Assignee: Pioneer Corporation, Tokyo (JP)

( * ) Notice: Subject to any disclaimer, the term of this patent is extended or adjusted under 35 U.S.C. 154(b) by 457 days.

(21) Appl. No.: 12/532,959

(22) PCT Filed: Mar. 30, 2007

(86) PCT No.: PCT/JP2007/057284
§ 371 (c)(1),
(2), (4) Date: Jan. 19, 2010

(87) PCT Pub. No.: WO2008/126323
PCT Pub. Date: Oct. 23, 2008

(65) Prior Publication Data

US 2010/0134340 A1 Jun. 3, 2010

(51) Int. Cl.
*H03M 7/00* (2006.01)

(52) U.S. Cl. ........ 341/176; 386/244; 386/337; 386/353; 386/263; 386/239; 348/734; 340/12.33; 340/12.55; 340/4.42; 382/103; 345/169; 725/106; 725/114; 725/133; 725/120

(58) Field of Classification Search .......... 341/150–176; 715/740; 345/169; 382/103; 700/65, 66; 348/734; 725/106, 114, 120, 133; 340/12.33, 340/12.55, 4.42; 386/244, 248, 263, 329, 386/337, 324, 318, 253, 239
See application file for complete search history.

(56) References Cited

U.S. PATENT DOCUMENTS

| | | | | |
|---|---|---|---|---|
| 5,619,251 | A * | 4/1997 | Kuroiwa et al. | 725/133 |
| 5,949,351 | A * | 9/1999 | Hahm | 340/4.42 |
| 6,031,962 | A * | 2/2000 | Sawabe et al. | 386/239 |
| 2008/0252509 | A1 * | 10/2008 | Yokozawa | 341/176 |

FOREIGN PATENT DOCUMENTS

| | | |
|---|---|---|
| JP | 06-35588 | 2/1994 |
| JP | 10-164673 | 6/1998 |
| JP | 2006-115196 | 4/2006 |

OTHER PUBLICATIONS

International Search Report for PCT/JP2007/057284, mailed May 1, 2007.
Takemura et al., "What you Look at is What you Control: A Universal Remote Control Based on Gaze Measurement Technology", IEEE Technical Exhibition Based Conference on Robotics and Automation Proceedings, (2004), 3 pages.
Matsumoto, "Kao Chishiten Keisoku O Mochiita Chiteki Computer Interface", Image Lab, vol. 16, No. 12, Dec. 1, 2005, 7 pages.
Ayatsuka et al., "Gaze-link: Jissekai Shiko user Interface ni Okeru' Miteiru Mono ni Setsuzoku Suru' Toiu Metaphor", Transactions of Information Processing Society of Japan, vol. 42, No. 6, Jun. 15, 2001, 10 pages.
"Universal Plug and Play (UPnP) Standardization", UPnP Forum; http://www.upnp.org.

* cited by examiner

*Primary Examiner* — Lam T Mai
(74) *Attorney, Agent, or Firm* — Nixon & Vanderhye P.C.

(57) ABSTRACT

A remote control system (1) comprises a plurality of controlled devices (100, 100*a*, etc.), a specifying means (101) for specifying one controlled device (100) that the user desires as a remote control target, and a control device (200) for remotely controlling the one controlled device according to first identification information for identifying the one controlled device.

9 Claims, 11 Drawing Sheets

[FIG. 1]
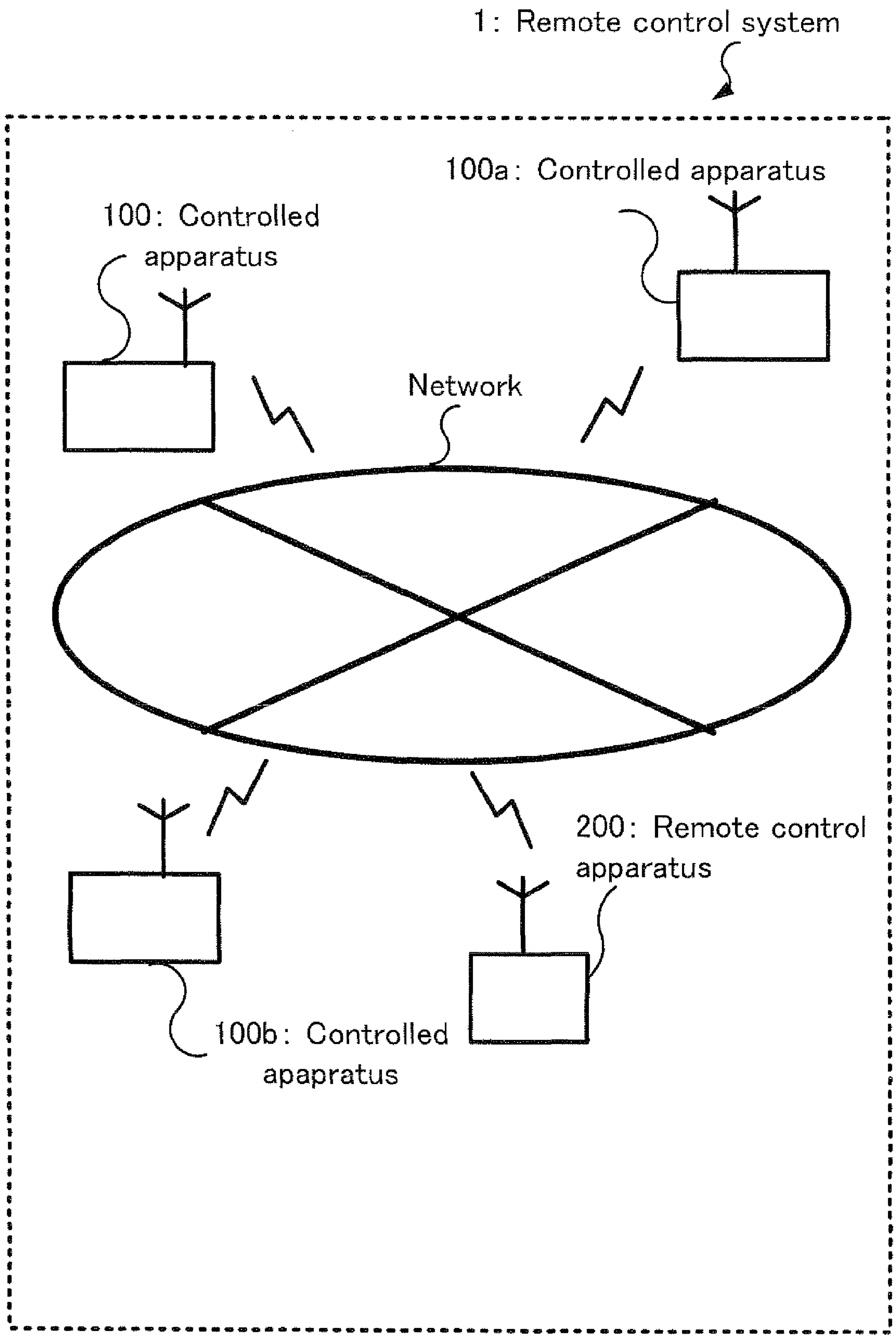

[FIG. 2]
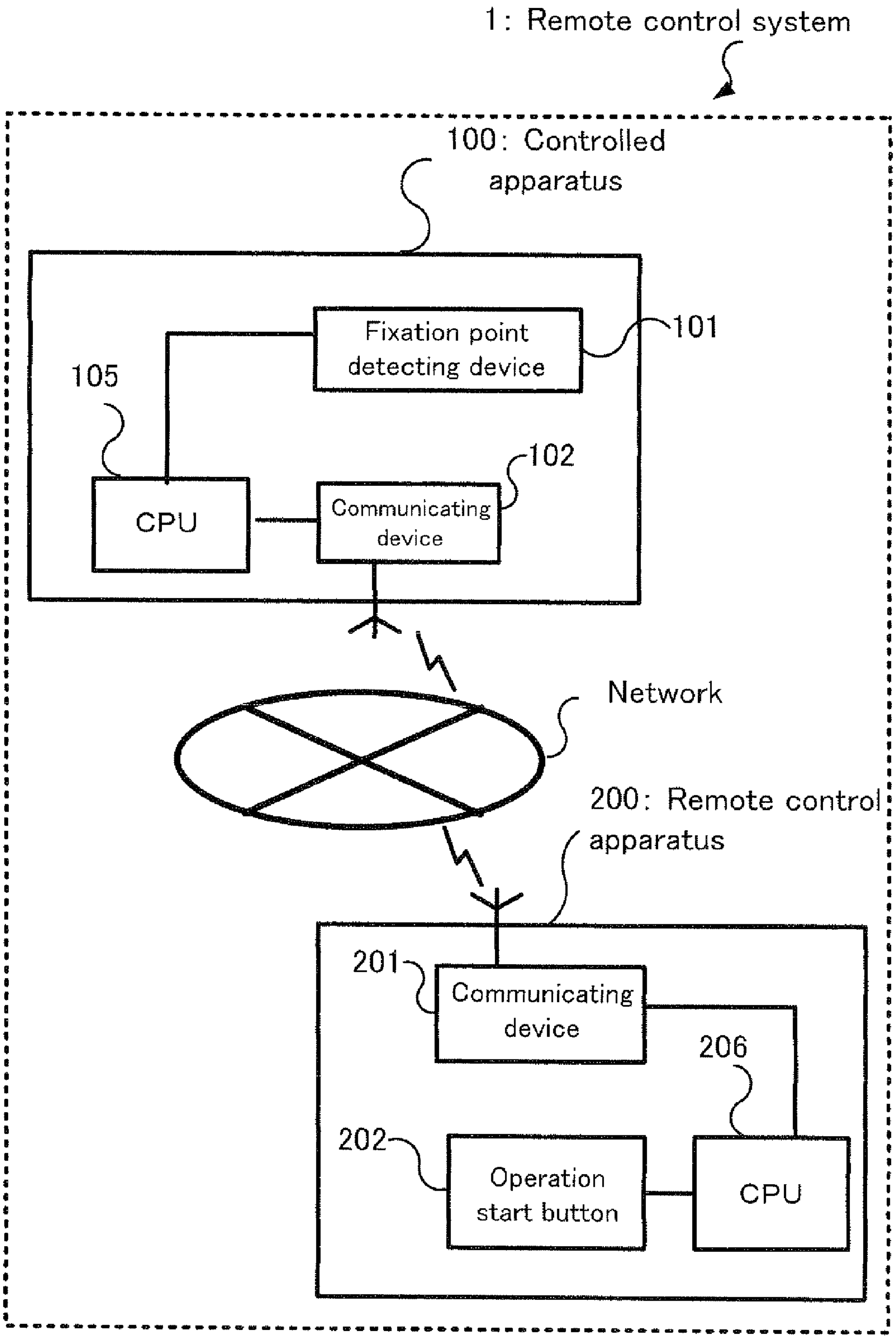

[FIG. 3]
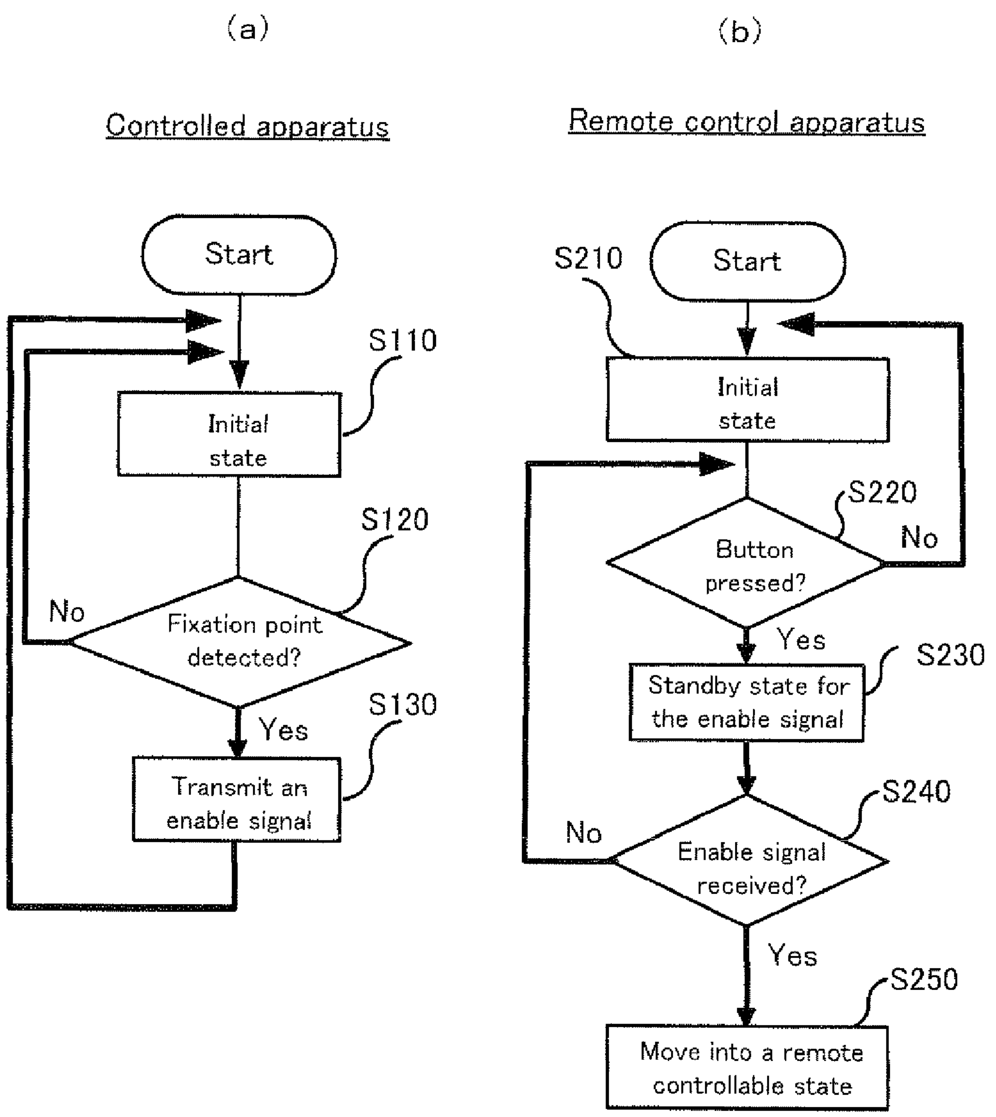

[FIG. 4]
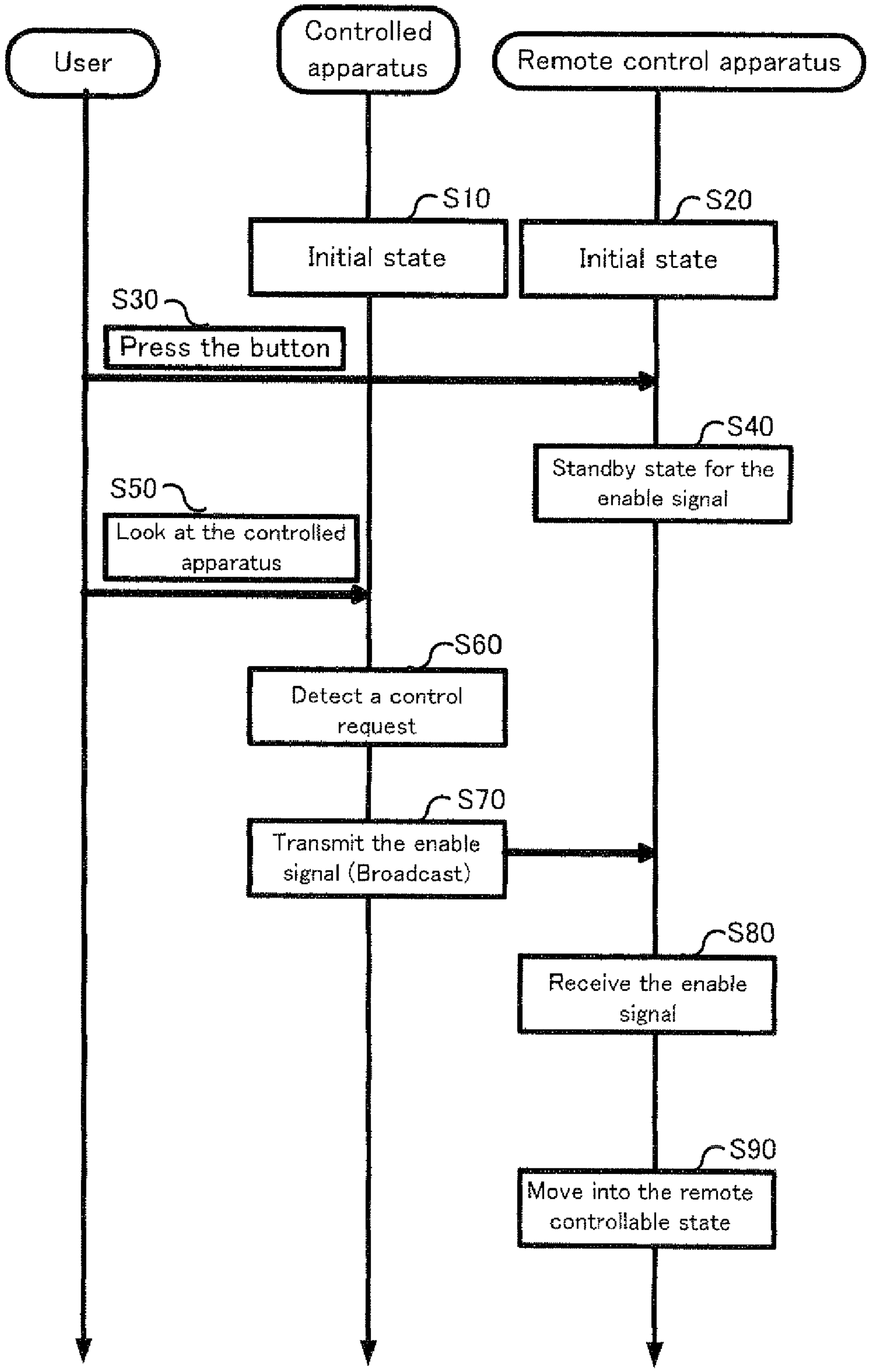

[FIG. 5]
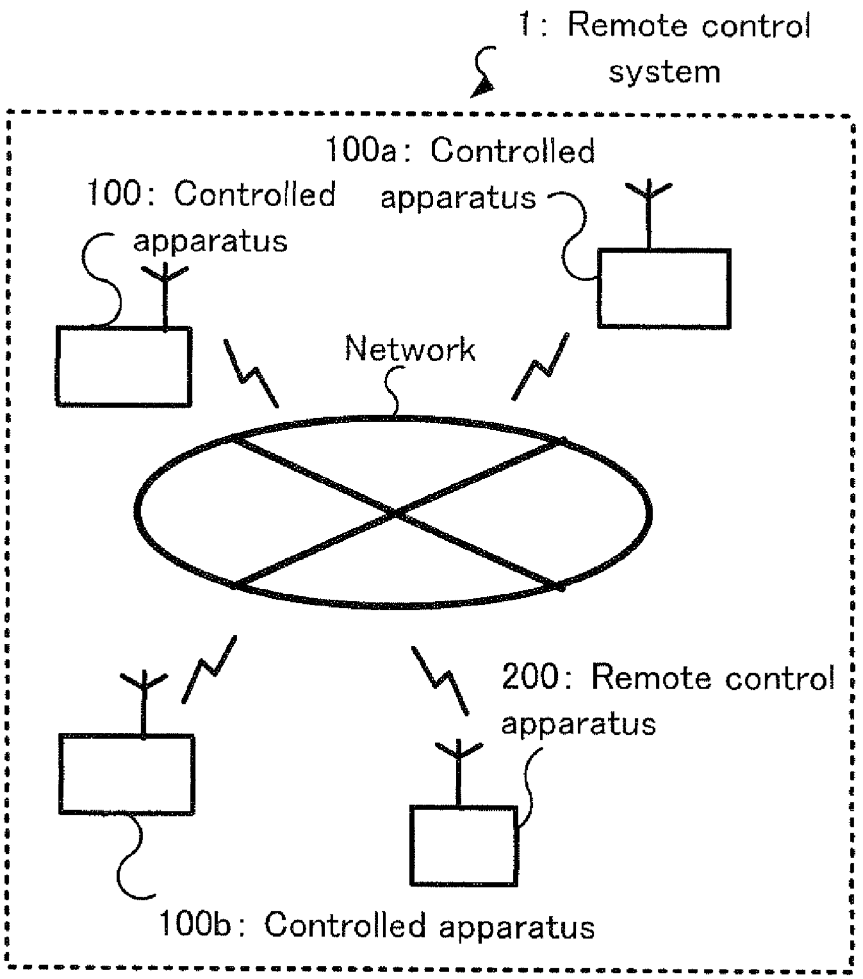
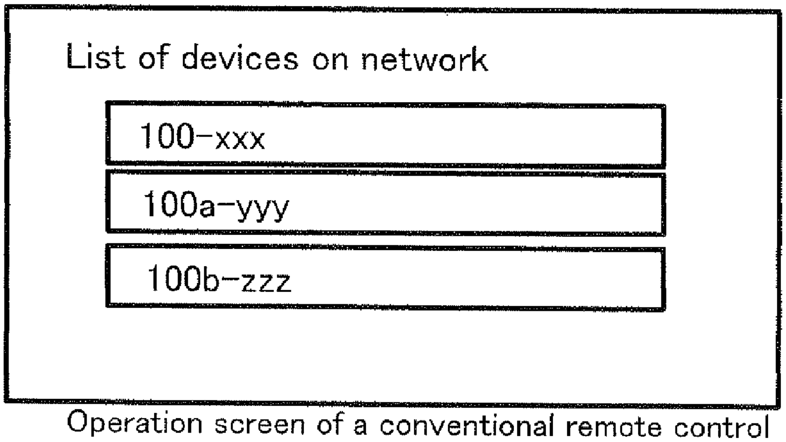
Operation screen of a conventional remote control apparatus (200)

[FIG. 6]
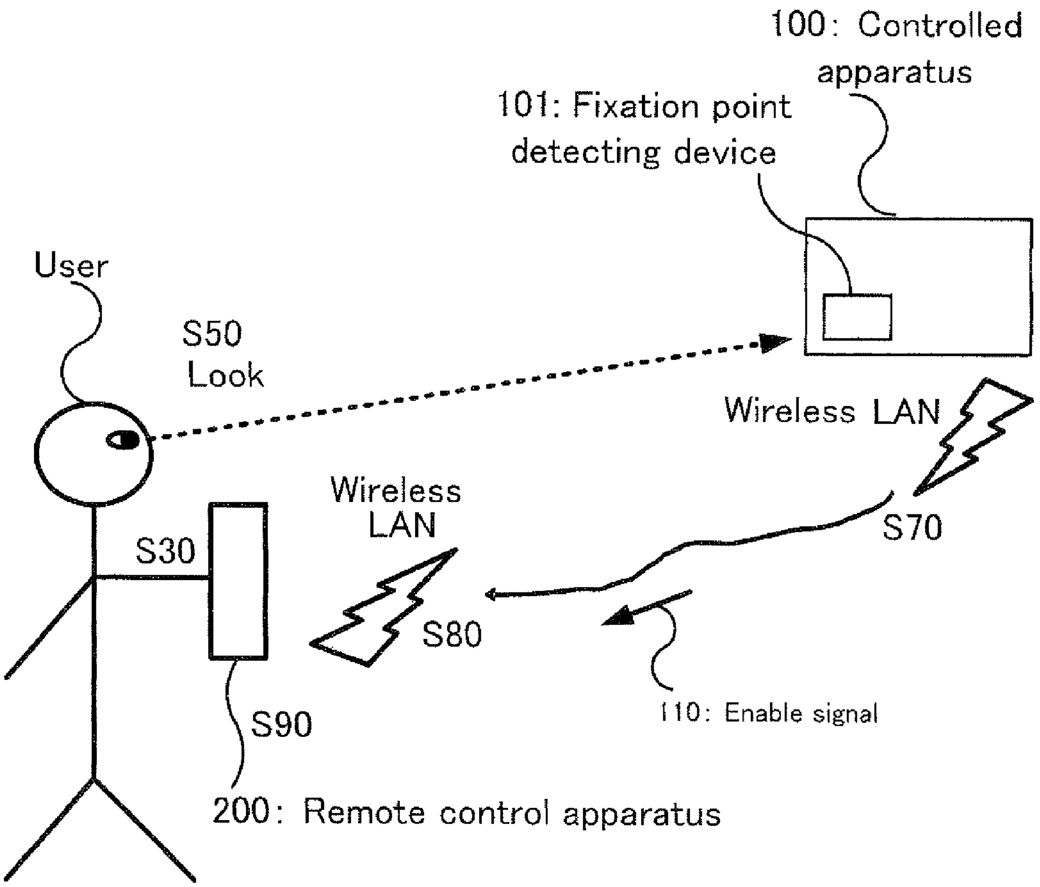

[FIG. 7]
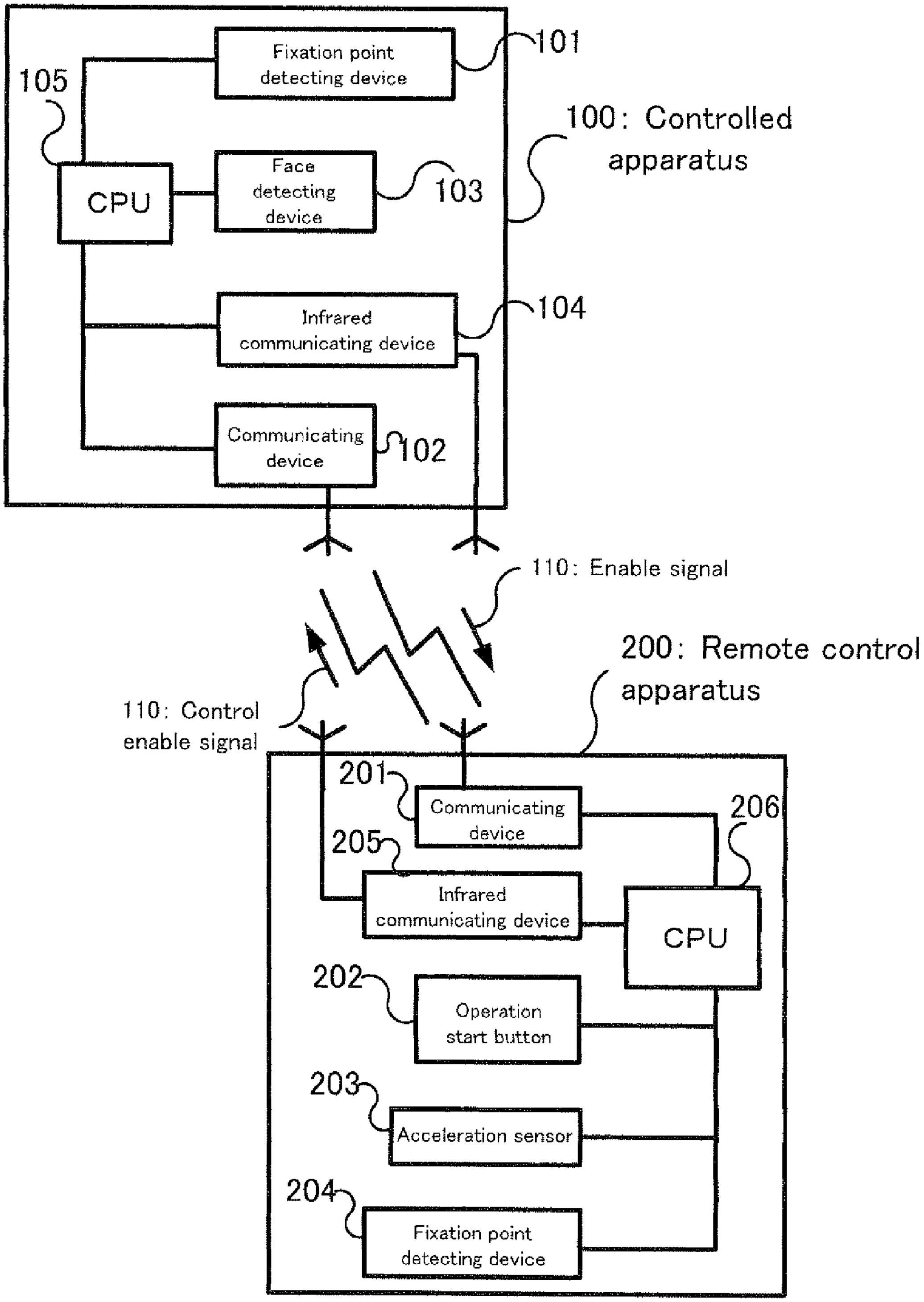

[FIG. 8]
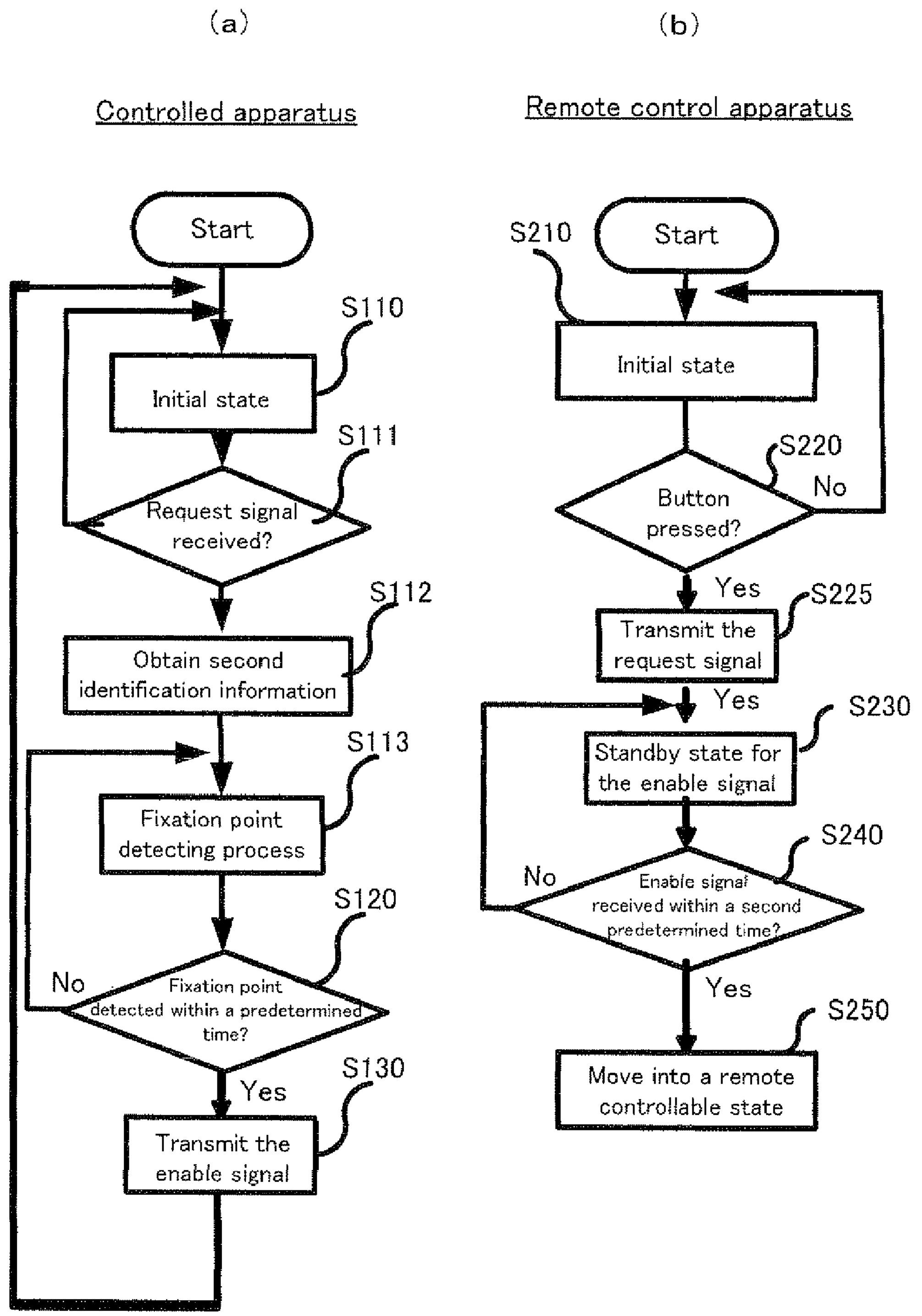

[FIG. 9]
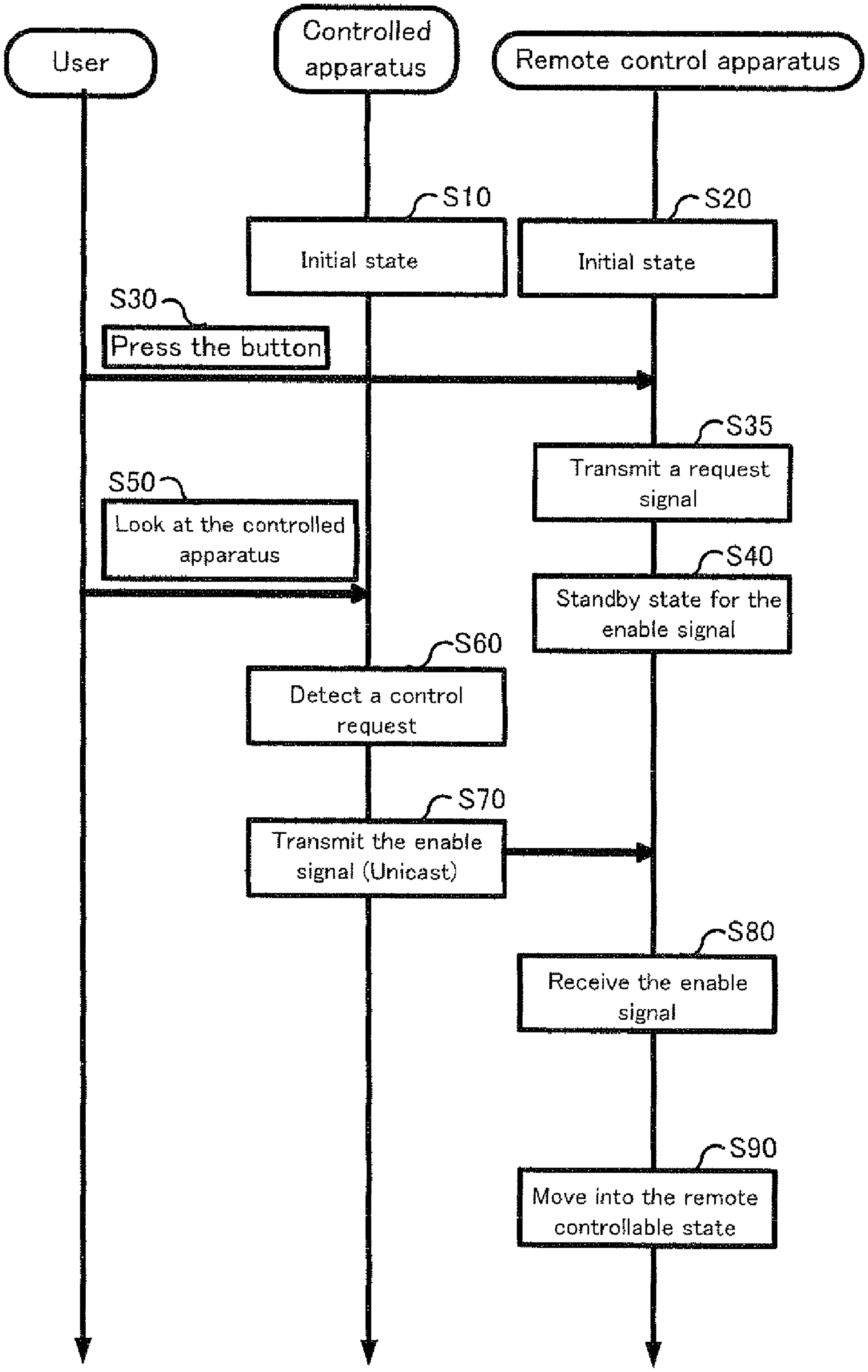

[FIG. 10]
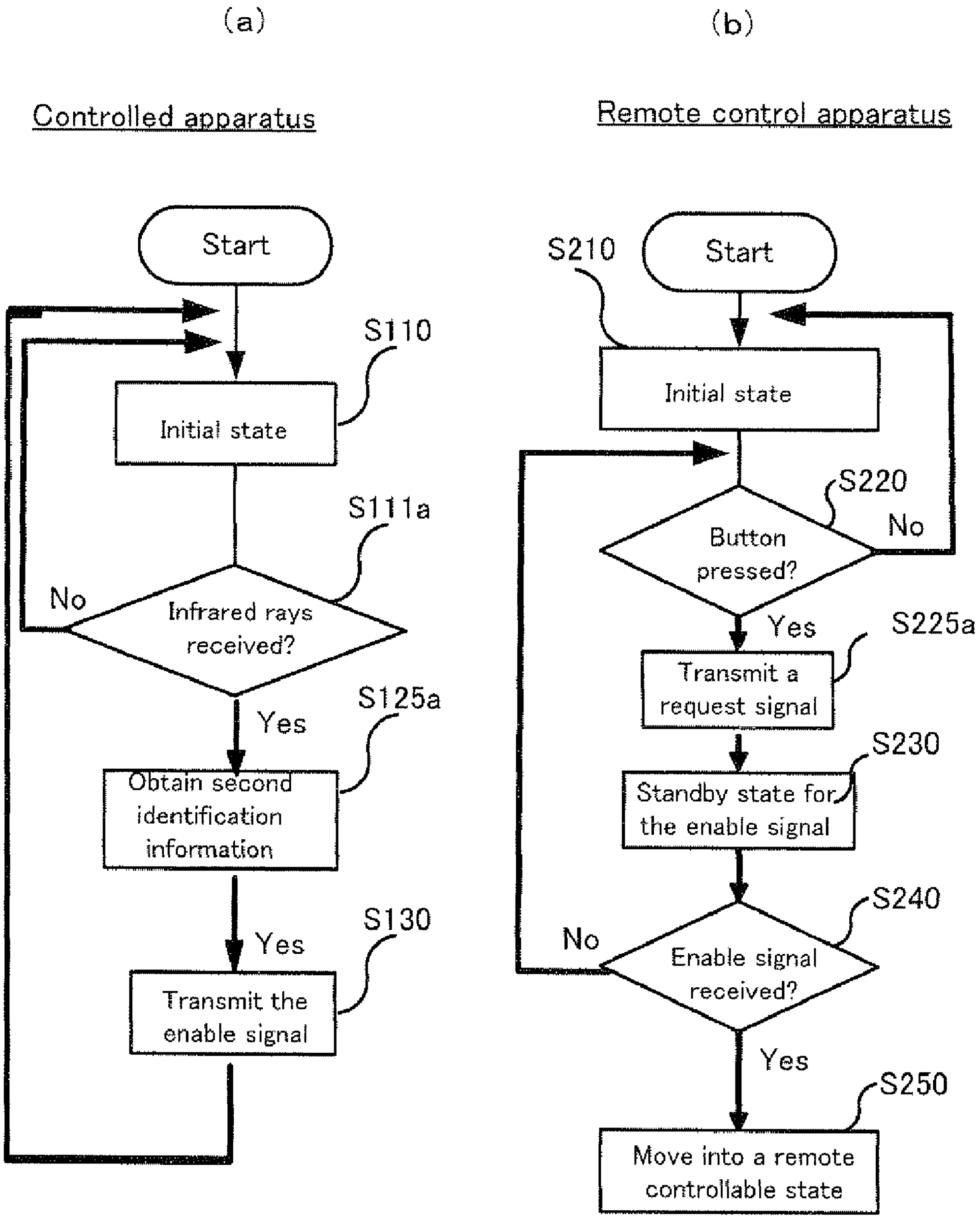

[FIG. 11]
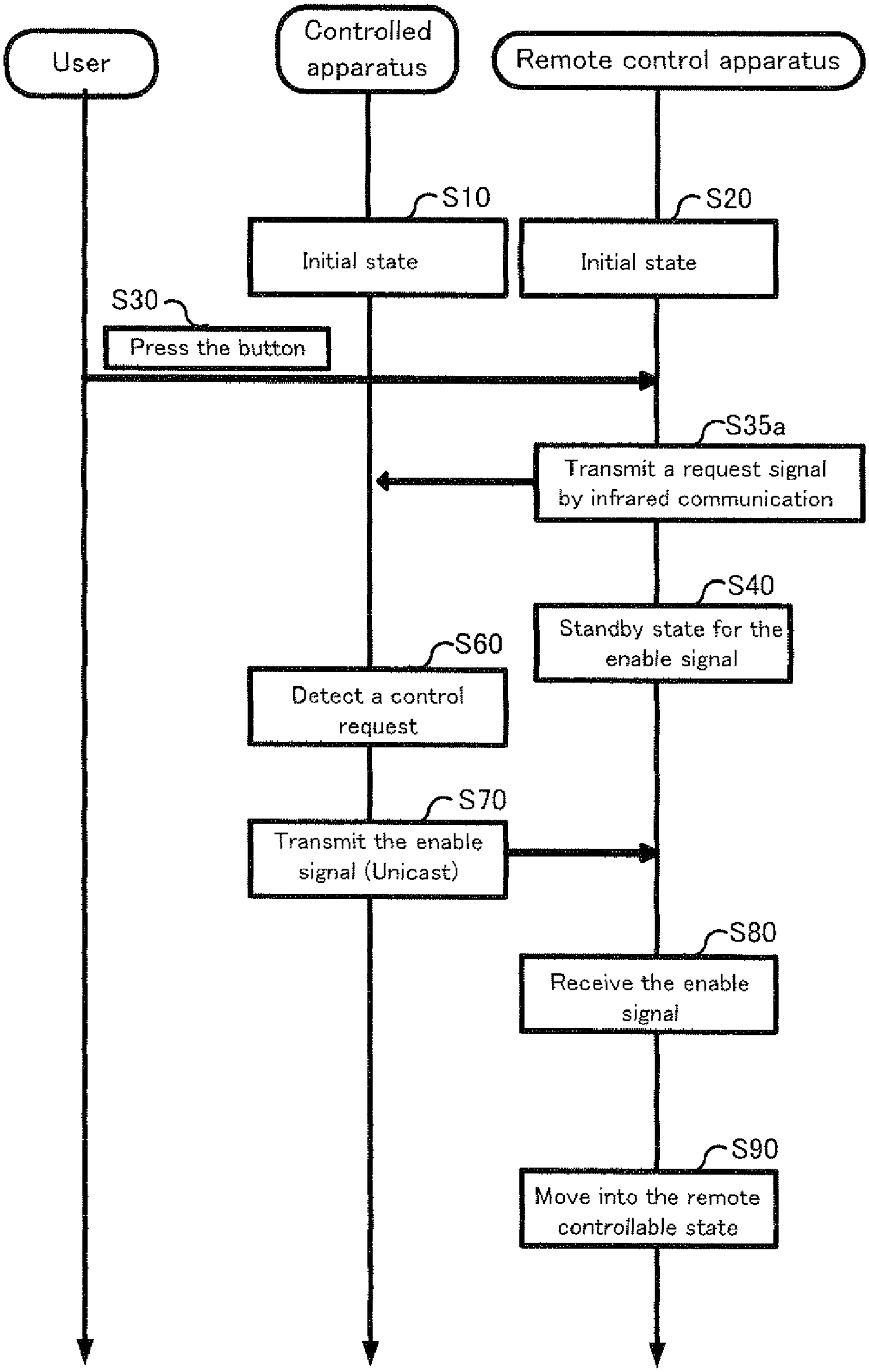

REMOTE CONTROL SYSTEM AND METHOD OF CONTROLLING THE REMOTE CONTROL SYSTEM

This application is the U.S. national phase of International Application No. PCT/JP2007/057284, filed 30 Mar. 2007, which designated the U.S. the entire contents of which is hereby incorporated by reference.

TECHNICAL FIELD

The present invention relates to a remote control system which can remote-control a plurality of controlled apparatuses, and a method of controlling the remote control system.

BACKGROUND ART

In an infrared remote controller which is generally widely used, a controlled apparatus and the remote controller communicate a control signal in a "1:1" relation, and the remote controller remote-controls the controlled apparatus. Thus, a user performs an operation of directing the remote controller toward the controlled apparatus, and the natural and simple operation of the user who is intuitively aware of one desired controlled apparatus allows the controlled apparatus to be remote-controlled.

Moreover, in a non-patent document 1 or the like, a method based on the UPnP (Universal Plug and Play) standard has been suggested, as a method of detecting and remote-controlling electronic devices on a network. On the other hand, as a remote control apparatus, a network remote controller for remote control has been recently used, which is connected to a communication line such as an Ethernet and a network complying with a wireless LAN standard, with a plurality of controlled apparatuses such as a plurality of types of electronic devices, and which can be identified in substantially the same address system position system) as that of the plurality of controlled apparatuses. If the aforementioned network remote controller is constructed on the basis of the aforementioned UPnP standard, the user manually selects the electronic device that the user desires to operate, from a list of the electronic devices displayed on an operation screen of the network remote controller.

Moreover, a patent document 1 or the like discloses a remote control method in which there are provided one mouse, a plurality of computers each of which is provided with a fixation point detecting apparatus, and a changing apparatus for changing a mouse signal. Specifically, the changing apparatus remote-controls the plurality of computers by changing the destination of the mouse signal with respect to one computer on which the user, who operates the mouse, turns one's eyes.

Non-Patent Document 1: Universal Plug And Play Standard (standardization by UPnP Forum)

Patent Document 1: Japanese Patent Application Laid Open No. Hei 6-35588

DISCLOSURE OF INVENTION

Subject to be Solved by the Invention

As disclosed in the non-patent document 1 or the like, however, the following problem possibly occurs if the one desired controlled apparatus is specified from the plurality of controlled apparatuses connected to the network, by an exclusive protocol included in a control signal to be communicated through the network; namely, the user needs to select the one controlled apparatus as a control target or operation target, from a plurality of identification information such as a name and a manufacturing number, each of which indicates respective one of the plurality of controlled apparatuses such as a list of the electronic devices displayed on the operation screen of a control apparatus. However, if the user does not know a correspondence between the plurality of identification information, each of which indicates respective one of the plurality of controlled apparatuses that can be controlled by the control apparatus, and the plurality of controlled apparatuses which exist in an actual space such as a room and which can be viewed, it is technically hard for the user to specify and control the one desired controlled apparatus on the operation screen of the control apparatus, properly and quickly. Thus, it remarkably reduces the convenience of operations with respect to the controlled apparatuses through the control apparatus by the user, which is technically problematic.

Alternatively, however, depending on the control apparatus such as a single mouse which switching-controls the plurality of computers and which is disclosed in the patent document 1 or the like, if the plurality of control apparatuses and the plurality of controlled apparatuses other than computers, such as a television and an air conditioner, are connected through a communicating device such as a network, it is technically hard to automatically match the user's desired one controlled apparatus and the one controlled apparatus that can be controlled by the control apparatus.

In view of the aforementioned problems, it is therefore an object of the present invention to provide, for example, a remote control system which can operate a plurality of controlled apparatus, properly and easily, and a method of controlling the remote control system.

Means for Solving the Subject

The above object of the present invention can be achieved by a remote control system provided with: a plurality of controlled apparatuses; a specifying device (e.g. a fixation point detecting device) for specifying one controlled apparatus that is desired by a user as a remote control target, from the plurality of controlled apparatuses; and a control apparatus for remote-controlling the one controlled apparatus on the basis of first identification information which identifies the specified one controlled apparatus.

The above object of the present invention can be achieved by a method of controlling a remote control system provided with a plurality of controlled apparatuses and a control apparatus which can remote-control each of the plurality of controlled apparatuses, the method provided with: a specifying process (e.g. a fixation point detecting device) of specifying one controlled apparatus that is desired by a user as a remote control target, from the plurality of controlled apparatuses; and a remote controlling process of remote-controlling the one controlled apparatus, on the basis of first identification information which identifies the specified one controlled apparatus.

The operation and other advantages of the present invention will become more apparent from embodiments explained below.

BEST MODE FOR CARRYING OUT THE INVENTION

Hereinafter, as the best mode for carrying out the present invention, an explanation will be given on a remote control system and method in embodiments of the present invention, in order.

(Embodiment of Remote Control System)

Hereinafter, an explanation will be given on a remote control system in an embodiment of the present invention.

An embodiment of the remote control system of the present invention is a remote control system provided with: a plurality of controlled apparatuses; a specifying device (e.g. a fixation point detecting device) for specifying one controlled apparatus that is desired by a user as a remote control target, from the plurality of controlled apparatuses; and a control apparatus for remote-controlling the one controlled apparatus on the basis of first identification information which identifies the specified one controlled apparatus.

According to the embodiment of the remote control system of the present invention, for example, the one controlled apparatus that is desired by the user as the remote control target, is specified from the plurality of controlled apparatuses by the specifying device such as a fixation point detecting device for detecting a user's fixation point. Here, the "control apparatus" of the present invention means a control apparatus that selects one of the plurality of controlled apparatuses and that remote-controls the selected one controlled apparatus. Moreover, the "controlled apparatuses" mean various apparatuses which are control targets or remote control targets of the aforementioned control apparatus, such as electronic devices. One specific example of the control apparatus is a so-called network remote controller, i.e. a control apparatus for remote control; which is connected to a communication line such as a network complying with a predetermined LAN (Local Area Network) standard and a predetermined wireless LAN standard, with a plurality of controlled apparatuses such as a plurality of types of electronic devices; and which can be identified in substantially the same address system (or position system) as that of the plurality of controlled apparatuses. Specifically, in the network remote controller, one control apparatus can remote-control a plurality of controlled apparatuses; namely, they may be in a "one to many" relationship or "one:many" relationship. Alternatively, a plurality of control apparatuses can remote-control a plurality of controlled apparatuses, respectively; namely, they may be in a "many to many" relationship or a "many:many" relationship. As described above, the network remote controller remarkably differs performances and functions from an infrared remote controller in which one control apparatus can remote-control one controlled apparatus, i.e. they are in a "1 to 1" relationship or a "1:1" relationship.

Then, the one controlled apparatus is remote-controlled by the control apparatus on the basis of the first identification information which identifies the specified one controlled apparatus.

As disclosed in the non-patent document 1 or the like, the following problem possibly occurs if the one desired controlled apparatus is specified from the plurality of controlled apparatuses connected to the network, by an exclusive protocol included in a control signal to be communicated through the network. Namely, the user needs to select the one desired controlled apparatus as the control target or operation target, from a plurality of identification information such as a name or a manufacturing number. The plurality of identification information indicates respective one of the plurality of controlled apparatuses such as a list of the electronic devices displayed on the operation screen of a control apparatus. However, if the user does not know a correspondence or correspondence relationship between (i) the plurality of identification information, each of which indicates respective one of the plurality of controlled apparatuses that can be controlled by the control apparatus, and (ii) the plurality of controlled apparatuses which exist in an actual space such as a room and which can be viewed; it is technically hard for the user to specify and control the one desired controlled apparatus on the operation screen of the control apparatus, properly and quickly. Thus, it remarkably reduces the convenience of operations with respect to the controlled apparatuses through the control apparatus by the user, which is technically problematic.

Alternatively, however, by the control apparatus or depending on the control apparatus, such as a single mouse which switching-controls the plurality of computers and which is disclosed in the patent document 1 or the like; if the plurality of control apparatuses and the plurality of controlled apparatuses other than computers, such as a television and an air conditioner, are connected through a communicating device such as a network; it is technically hard to automatically match (i) the user's desired one controlled apparatus and (ii) the one controlled apparatus that can be controlled by the control apparatus.

Alternatively, in the infrared remote controller which is generally widely used, the controlled apparatus and the remote controller communicate a control signal in a "1 to 1" relationship or a "1:1" relation, and the remote controller remote-controls the controlled apparatus. Thus, the user performs an operation of directing the remote controller toward the controlled apparatus; and the natural and simple operation of the user who is intuitively aware of the one desired controlled apparatus allows the controlled apparatus to be remote-controlled. However, in the so-called network remote controller, i.e. the control apparatus for remote control, in which a plurality of types of electronic devices is connected to a communication line such as a network complying with a predetermined LAN standard and a predetermined wireless LAN standard, the plurality of electronic devices on the network can be operated by remote control, whereas it is technically hard to remote-control the controlled apparatus by the natural and simple operation of the user who is intuitively aware of the one desired controlled apparatus. This is because various processes are not performed, which associate (i) a plurality of electronic devices logically defined by the communication protocol on the network and (ii) a plurality of electronic devices disposed in the actual space.

In contrast, according to the embodiment, the one controlled apparatus that is desired by the user as the remote control target, is specified from the plurality of controlled apparatuses by the specifying device such as a fixation point detecting device for detecting the user's fixation point. Then, the one controlled apparatus is remote-controlled by the control apparatus on the basis of the first identification information which identifies the specified one control apparatus.

Therefore, it is possible to automatically match (i) the one controlled apparatus that is desired by the user as a control target or operation target and (ii) the one controlled apparatus that can be controlled by the control apparatus (in other words, one controlled apparatus that has an established communication line for transmitting and receiving the control signal with the control apparatus). As a result, it is possible to almost or completely eliminate the necessity to perform a complicated manual operation of selecting the one controlled apparatus that is desired by the user as a control target or operation target, from the plurality of identification information such as a name and a manufacturing number, in order to match (i) the one controlled apparatus that the user desires to control and (ii) the one controlled apparatus that has the established communication line for transmitting and receiving the control signal with the control apparatus. The plurality of identification information indicates respective one of the plurality of controlled apparatuses such as a list of the electronic devices displayed on the operation screen of a control apparatus.

Consequently, since (i) the one controlled apparatus that is desired by the user as the control target or operation target and (ii) the one controlled apparatus that can be controlled by the control apparatus, are automatically matched; the user can control and operate each of the plurality of controlled apparatuses, mentally comfortably or easily, and it is possible to remarkably improve the convenience of the operations with respect to the plurality of controlled apparatuses through the control apparatus by the user.

In one aspect of the remote control system of the present invention, the specifying device specifies the one controlled apparatus on the basis of whether or not the user's face can be detected; in addition to or instead of specifying the one controlled apparatus on the basis of a fixation point on which the user's eyes are fixed.

According to this aspect, it is possible to automatically match the one controlled apparatus that is desired by the user, which is highly accurately specified by detecting the fixation point or the user's face, and the one controlled apparatus that can be controlled by the control apparatus.

Specifically, the following two operations performed by the user make it possible to automatically match the one controlled apparatus that is desired by the user as the control target or operation target and the one controlled apparatus that has an established communication line for transmitting and receiving the control signal with the control apparatus. The user's first operation is holding the control apparatus, and the second operation is directing one's eyes on the controlled apparatus. In other words, the two operations make it possible to automatically establish the communication line for transmitting and receiving the control signal between the control apparatus held by the user and the one controlled apparatus that is desired by the user as the control target or operation target.

As a result, it is possible to automatically match the one controlled apparatus that is desired by the user and the one controlled apparatus that can be controlled by the control apparatus, by the natural and simple operation of the user who is intuitively aware of the desired one controlled apparatus, such as the user's operation of holding the control apparatus or the user's operation of turning one's eyes on the controlled apparatus desired by the user as the control target or operation target.

In another aspect of the remote control system of the present invention, the control apparatus is provided with: a first receiving device for receiving the first identification information; a first transmitting device for transmitting second identification information which identifies the control apparatus; and a remote controlling device for identifying and remote-controlling the one controlled apparatus on the basis of the first identification information, and the one controlled apparatus is provided with: a second receiving device for receiving the transmitted second identification information; and a second transmitting device for transmitting the first identification information to the control apparatus specified by the received second identification information.

According to this aspect, the one controlled apparatus transmits the first identification information to the control apparatus specified by the received second identification information, so that the remote controlling device owned by the control apparatus can remote-control the one controlled apparatus on the transmitted first transmission information, properly, highly accurately, and highly confidentially.

In an aspect associated with the second transmitting device described above, the second transmitting device may transmit the first identification information in addition to an enable signal for allowing the control apparatus to control the one controlled apparatus, after the one controlled apparatus is specified by the specifying device.

By virtue of such construction, the control apparatus remote-controls the one controlled apparatus on the basis of the first identification information and the enable signal, so that the control apparatus can remote-control the one controlled apparatus, more properly, more highly accurately, and more highly confidentially.

Another embodiment of the remote control system of the present invention is a remote control system provided with: a plurality of controlled apparatuses; and a control apparatus for remote-controlling the controlled apparatuses, the plurality of controlled apparatuses provided with: a first detecting device for detecting at least one of a user's eyes, the user's face direction, and infrared irradiation; a specifying device for specifying one controlled apparatus that is desired by the user as a remote control target, on the basis of the detected at least one of the user's eyes, the user's face direction, and infrared irradiation; a second receiving device for receiving second identification information which identifies the control apparatus; and a second transmitting device for transmitting (i) an enable signal for allowing the control apparatus to control the one controlled apparatus, in addition to (ii) first identification information which identifies the specified one controlled apparatus, to the control apparatus identified by the received second identification information, the control apparatus provided with: a first receiving device for receiving the first identification information; a first transmitting device for transmitting the second identification information; and a remote controlling device for identifying and remote-controlling the one controlled apparatus on the basis of the first identification information.

According to another embodiment of the remote control system of the present invention, it is possible to receive various benefits provided for the aforementioned embodiment of the remote control system of the present invention.

Incidentally, in response to the aforementioned various aspects in the embodiment of the remote control system of the present invention, another embodiment of the remote control system of the present invention can also adopt various aspects.

In an aspect associated with the first transmitting device and the second transmitting device described above, the first transmitting device may transmit the second identification information in addition to a request signal for requesting permission for said control apparatus to control the one controlled apparatus, and the second transmitting device may transmit the first identification information in addition to an enable signal for allowing said control apparatus to control the one controlled apparatus, after the request signal is received by the second receiving device.

By virtue of such construction, the control apparatus remote-controls the one controlled apparatus on the basis of the first identification information and the enable signal after the reception of the request signal, so that the control apparatus can remote-control the one controlled apparatus, more properly, more highly accurately, and more highly confidentially. Incidentally, the request signal may further indicate that the user holds the control apparatus.

Moreover, in an aspect associated with the first transmitting device and the second transmitting device described above, the second transmitting device may transmit the first identification information in addition to the enable signal; if the one controlled apparatus is specified within a predetermined time by the specifying device, after the request signal is received by the second receiving device.

By virtue of such construction, the control apparatus remote-controls the one controlled apparatus if the one controlled apparatus is specified within the predetermined time by the specifying device after the request signal is received, so that the control apparatus can remote-control the one controlled apparatus on the basis of the first identification information and the enable signal, more properly, more highly accurately, and more highly confidentially.

In an aspect associated with the control apparatus described above, the control apparatus may be further provided with: a judging device for judging whether or not the user holds said control apparatus; and a controlling device for controlling the first transmitting device to transmit the second identification information, if it is judged that the user holds said control apparatus.

By virtue of such construction, the one controlled apparatus can properly transmit the first identification information to the control apparatus judged to be held by the user.

Specifically, for example, the following three operations performed by the user make it possible to automatically match (i) the one controlled apparatus that is desired by the user as the control target or operation target and (ii) the one controlled apparatus that has the established communication line for transmitting and receiving the control signal with the control apparatus. The user's first operation is holding the control apparatus, the second operation is pressing a detection button for making the control apparatus detect the start of the operation, and the third operation is turning one's eyes on the controlled apparatus. In other words, the three operations make it possible to automatically establish the communication route for transmitting and receiving the control signal between (i) the control apparatus held by the user and (ii) the one controlled apparatus desired by the user as the control target or operation target.

As a result, it is possible to automatically match (i) the one controlled apparatus that is desired by the user and (ii) the one controlled apparatus that can be controlled by the control apparatus, by the natural and simple operation or manipulation of the user who is intuitively aware of the desired one controlled apparatus, such as the user's operation or manipulation of holding the control apparatus or the user's operation or manipulation of turning one's eyes on the controlled apparatus desired by the user as the control target or operation target.

Moreover, in an aspect associated with the control apparatus described above, the control apparatus may be further provided with a second detecting device for detecting a change in kinetic energy on the control apparatus, and the judging device may judge whether or not the user holds the control apparatus, on the basis of the detected change in kinetic energy.

By virtue of such construction, the control apparatus can judge whether or not the user holds the control apparatus on the basis of the change in kinetic energy, more properly.

Moreover, in an aspect associated with the control apparatus described above, the control apparatus is further provided with a detecting device for detecting a fixation point on which the user's eyes are fixed with respect to the control apparatus, and the judging device judges whether or not the user holds the control apparatus, on the basis of the detected fixation point.

By virtue of such construction, the control apparatus can judge whether or not the user holds the control apparatus, more properly, from whether or not the fixation point is detected.

In an aspect associated with the first and second transmitting devices and the first and second receiving devices described above, the first receiving device may receive the first identification information through infrared rays, the first transmitting device may transmits the second identification information through infrared rays, the second receiving device may receive the second identification information through infrared rays, and the second transmitting device may transmits the first identification information through infrared rays.

By virtue of such construction, the control apparatus can remote-control the one controlled apparatus on the basis of the low-cost communication method through infrared rays, properly, highly accurately, and highly confidentially.

(Embodiment of Method of Controlling Remote Control System)

Hereinafter, an explanation will be given on a method of controlling the remote control system in an embodiment of the present invention.

An embodiment of the method of controlling the remote control system of the present invention is a method of controlling a remote control system provided with a plurality of controlled apparatuses and a control apparatus which can remote-control each of the plurality of controlled apparatuses, the method provided with: a specifying process (e.g. a fixation point detecting device) of specifying one controlled apparatus that is desired by a user as a remote control target, from the plurality of controlled apparatuses; and a remote controlling process of remote-controlling the one controlled apparatus, on the basis of first identification information which identifies the specified one controlled apparatus.

According to the embodiment of the method of controlling the remote control system of the present invention, it is possible to receive the various benefits provided for the embodiment of the remote control system of the present invention described above.

Incidentally, in response to the various aspects of the remote control system of the present invention described above, the embodiment of the method of controlling the remote control system of the present invention can also adopt various aspects.

The operation and other advantages of the present invention will become more apparent from examples explained below.

As explained above, according to the embodiment of the remote control system of the present invention, it is provided with the plurality of controlled apparatus, the control apparatus, the specifying device, and the controlling device. According to the embodiment of the remote control system of control method of the present invention, it is provided with the specifying process and the controlling process, in the remote control system provided with the plurality of controlled apparatus and the control apparatus. As a result, since the one controlled apparatus that is desired by the user as the control target or operation target and the one controlled apparatus that can be controlled by the control apparatus are automatically matched, the user can control and operate the controlled apparatuses, mentally comfortably or easily, and it is possible to remarkably improve the convenience of the operations with respect to the controlled apparatuses through the control apparatus by the user.

BRIEF DESCRIPTION OF DRAWINGS

FIG. 1 is a block diagram conceptually showing the basic structure of a remote control system 1 in an example.

FIG. 2 is a block diagram conceptually showing the basic structure of a controlled apparatus and a remote control apparatus 200 in the example.

FIG. 3 are a flowchart showing a flow of a communication process in which the controlled apparatus is focused on (FIG. 3(*a*)) and a flowchart showing a flow of a communication process in which the remote control apparatus is focused on (FIG. 3(*b*)), in the remote control system 1 in the example.

FIG. 4 is a timing chart showing a series of timings of a user's operation, an operation of the controlled apparatus, and an operation of the remote control apparatus, in the remote control system 1 in the example.

FIG. 5 is a schematic diagram showing a conventional problem.

FIG. 6 is a schematic diagram conceptually showing various processes in the remote control system 1 in the example.

FIG. 7 is a block diagram showing the basic structure of a remote control system 1 in a second example.

FIG. 8 are a flowchart showing a flow of a communication process in which the controlled apparatus is focused on (FIG. 8(*a*)) and a flowchart showing a flow of a communication process in which the remote control apparatus is focused on (FIG. 8(*b*)), in the remote control system 1 in the second example.

FIG. 9 is a timing chart showing a series of timings of a user's operation, an operation of the controlled apparatus, an operation of the remote control apparatus, in the remote control system 1 in the second example.

FIG. 10 are a flowchart showing a flow of a communication process in which the controlled apparatus is focused on (FIG. 10(*a*)) and a flowchart showing a flow of a communication process in which the remote control apparatus is focused on (FIG. 10(*b*)), in a remote control system 1 in a third example.

FIG. 11 is a timing chart showing a series of timings of a user's operation, an operation of the controlled apparatus, an operation of the remote control apparatus, in the remote control system 1 in the third example.

DESCRIPTION OF REFERENCE CODES

1 remote control system
100 controlled apparatus
101 fixation point detecting device
102 communicating device
105 CPU
200 remote control apparatus
201 communicating device
202 operation start button
206 CPU

EXAMPLES

Hereinafter, examples of the present invention will be explained on the basis of the drawings.

(Example of Remote Control System)

With reference to FIG. 1 to FIG. 4, an explanation will be given on examples of a remote control system of the present invention.

(1) Basic Structure

Firstly, with reference to FIG. 1 and FIG. 2, the basic structure of a remote control system 1 in the example. Here, FIG. 1 is a block diagram conceptually showing the basic structure of the remote control system 1 in the example. FIG. 2 is a block diagram conceptually showing the basic structure of a controlled apparatus and a remote control apparatus 200 in the example.

As shown in FIG. 1, the remote control system 1 in the example, is provided with; a controlled apparatus 100, a controlled apparatus 100*a*, and a controlled apparatus 100*b*, such as a plurality of electronic devices; and a remote control apparatus 200 for remote-controlling the controlled apparatus. Here, the "remote control apparatus" in the example, means a control apparatus for selecting one of the plurality of controlled apparatuses and for remote-controlling the selected one controlled apparatus. The remote control apparatus constitutes one specific example of the control apparatus of the present invention. Moreover, the "controlled apparatuses" in the example, mean various apparatuses which are remote-control targets or operation targets of the remote control apparatus described above, such as electronic devices. One specific example of the remote control apparatus is a so-called network remote controller, i.e. a control apparatus for remote control; which is connected to a communication line such as a network complying with a predetermined LAN standard and a predetermined wireless LAN standard, with a plurality of controlled apparatuses such as a plurality of types of electronic devices, and which can be identified in substantially the same address system (or position system) as that of the plurality of controlled apparatuses. Specifically, in the network remote controller, one control apparatus can remote-control a plurality of controlled apparatuses; namely, they may be in a "one to many" relationship or a "one:many" relation. Alternatively, a plurality of control apparatuses can remote-control a plurality of controlled apparatuses, respectively; namely, they may be in a "many to many" relationship or a "many:many" relation. As described above, the network remote controller remarkably differs in performances and functions from an infrared remote controller in which one control apparatus can remote-control one controlled apparatus, i.e. they are in a "1 to 1" relationship or a "1:1" relation.

Moreover, the controlled apparatus 100, which is one of the plurality of controlled apparatus, is provided with; a fixation point detecting device 101 which can detect a fixation point on which a user's eyes are fixed; a communicating device 102 which can connect to a network complying with, for example, a predetermined LAN standard and a predetermined wireless LAN standard; and a CPU (Central Processing Unit) 105 for integrally controlling the controlled apparatus 100, as shown in FIG. 2. Moreover, the remote control apparatus 200 is provided with; a communicating device 201 which can connect to the network complying with, for example, the predetermined LAN standard, an operation start button 202 for detecting the start of an operation by the user; and a CPU 206 for integrally controlling the controlled apparatus 100. Incidentally, the CPU 206 constitutes one specific example of the remote controlling device of the present invention.

(2) Operation Principle

Next, with reference to FIG. 3 and FIG. 4, an explanation will be given on the operation principle of the remote control system 1 in the example. FIG. 3 are a flowchart showing a flow of a communication process in which the controlled apparatus is focused on (FIG. 3(*a*)) and a flowchart showing a flow of a communication process in which the remote control apparatus is focused on (FIG. 3(*b*)), in the remote control system 1 in the example.

(2-1) Operation Principle—Communication Processes of Controlled Apparatus

As shown in FIG. 3(*a*), on the controlled apparatus 100 in the remote control system 1 in the example, firstly, various communication processes for connecting to the network are performed as an initial state, under the integrated control of the CPU 105 (step S110).

Then, it is judged whether or not the fixation point on which the user's eyes are fixed, is detected by the fixation point detecting device 101, under the integrated control of the CPU 105 (step S120). Here, if it is judged that the fixation point on which the user's eyes are fixed, is detected (the step S120: Yes), an enable signal is transmitted to the network by the communicating device 102 under the integrated control of the CPU 105, wherein the enable signal is to enable or allow remote control with respect to the controlled apparatus 100, the enable signal includes first identification information which can uniquely identify the controlled apparatus 100 and which can be such as an IP (Internet Protocol) address of the controlled apparatus (step S130). Then, the operational flow returns to the aforementioned step S110.

On the other hand, as a result of the step S120, if it is not judged that the fixation point on which the user's eyes are fixed, is detected (the step S120: No), as described above, various communication processes for connecting to the network, are performed as the initial state, under the integrated control of the CPU 105 (the step S110).

(2-2) Operation Principle—Communication Processes of Remote Control Apparatus

As shown in FIG. 3(*b*), on the remote control apparatus 200 in the remote control system 1 in the example, firstly, various communication processes for connecting to the network, are performed as an initial state, under the integrated control of the CPU 206 (step S210).

Then, it is judged whether or not the user has started an operation, by detecting the user's pressing down the operation start button 202, under the integrated control of the CPU 206 (step S220). Incidentally, in addition to or instead of the operation start button, it may be judged whether or not the user has started the operation by pressing an arbitrary button. Here, if the user's pressing down the operation start button 202 is detected, and it is judged that the user has started the operation (the step S220: Yes), the remote control apparatus 200 moves into a standby state in which the remote control apparatus 200 waits for the reception of the enable signal described above, under the integrated control of the CPU 206 (step S230).

Then, it is judged whether or not the aforementioned enable signal is received, under the integrated control of the CPU 206 (step S240). Here, if it is judged that the aforementioned enable signal is received (the step S240: Yes), the remote control apparatus 200 moves into a remote controllable state, in which the controlled apparatus 100 uniquely identified by the first identification information included in the aforementioned enable signal, can be remote-controlled, under the integrated control of the CPU 206 (step S250).

(2-3) Operation Principle—Timing of All Operations

Next, with reference to FIG. 4, an explanation will be given on a series of timings of a user's operation, an operation of the controlled apparatus, and an operation of the remote control apparatus, in the remote control system 1 in the example. FIG. 4 is a timing chart showing a series of timings of the user's operation, the operation of the controlled apparatus, and the operation of the remote control apparatus, in the remote control system 1 in the example.

As shown in FIG. 4, on the controlled apparatus 100 in the remote control system 1 in the example, firstly, various communication processes for connecting to the network, are performed as an initial state, under the integrated control of the CPU 105 (step S10). Simultaneously with or in tandem with this, on the remote control apparatus 200, various communication processes for connecting to the network, are performed as an initial state, under the integrated control of the CPU 206 (step S20).

Then, it is judged that the user has started the operation, on the remote control apparatus 200, for example, by detecting the user's pressing down the operation start button 202 (step S30).

Then, the remote control apparatus 200 moves into the standby state in which the remote control apparatus 200 waits for the reception of the enable signal 110 described above, under the integrated control of the CPU 206 (step S40).

Then, the user fixes one's eyes on the controlled apparatus 100 (step S50).

Then, the controlled apparatus 100 detects that the controlled apparatus 100 itself is requested to be remote-controlled, under the integrated control of the CPU 206 (step S60). Specifically, when the user turns one's eyes on the controlled apparatus 100, the fixation point detecting device 101 detects that.

Then, on the controlled apparatus 100, the enable signal is transmitted to the network by the communicating device 102 under the integrated control of the CPU 105, wherein the enable signal is to enable or allow the remote control with respect to the controlled apparatus 100, the enable signal includes the first identification information which can uniquely identify the controlled apparatus 100 and which can be such as an IP address of the controlled apparatus (step S70). Specifically, the enable signal 110 including the IP address, which can identify the self-equipment (i.e., the controlled apparatus 100), i.e. a unique identifier, is transmitted onto the network through the communicating device 102 in a broadcast method.

Then, on the remote control apparatus 200, the aforementioned enable signal is received under the integrated control of the CPU 206 (step S80). Specifically, the remote control apparatus 200 receives the enable signal by using the communicating device 201.

Then, the remote control apparatus 200 moves (or transits) into the remote controllable state, in which the controlled apparatus 100 uniquely identified by the first identification information included in the aforementioned enable signal, can be remote-controlled, under the integrated control of the CPU 206 (step S90).

(3) Study of Operation and Effects in Example

Next, with reference to FIG. 5 and FIG. 6, the operation and effects in the remote control system 1 in the example, will be studied. FIG. 5 is a schematic diagram showing a conventional problem. FIG. 6 is a schematic diagram conceptually showing various processes in the remote control system 1 in the example.

As performed in general, the following problem possibly occurs, if one desired controlled apparatus is specified from a plurality of controlled apparatuses connected to a network, by an exclusive protocol included in a control signal to be communicated through the network. Namely, the user needs to select the desired one controlled apparatus as a control target or operation target, from a plurality of identification information such as a name or a manufacturing number, the plurality of identification information indicates respective one of the plurality of controlled apparatuses such as a list of the electronic devices like a television, a DVD recorder, an air conditioner, and the like displayed on the operation screen or manipulated screen of the control apparatus, as shown in the lower part of FIG. 5. However, if the user does not know a correspondence relationship between (i) the plurality of identification information, each of which indicates respective one of the plurality of controlled apparatuses that can be controlled by the control apparatus, and (ii) the plurality of controlled apparatuses which exist in an actual space such as a room and which can be viewed; it is technically hard for the user to specify and control the one desired controlled apparatus on the operation screen of the control apparatus, properly and quickly. Thus, it remarkably reduces the convenience of operations or manipulation with respect to the controlled apparatuses through the control apparatus by the user, which is technically problematic.

Alternatively, as performed in general, by the control apparatus such as a single mouse which switching-controls a plurality of computers; if the plurality of control apparatuses and the plurality of controlled apparatuses other than computers, such as a television and an air conditioner, are connected through a communicating device such as a network; it is technically hard to automatically match (i) the user's desired one controlled apparatus and (ii) the one controlled apparatus that can be controlled by the control apparatus.

Alternatively, in an infrared remote controller which is generally widely used, the controlled apparatus and the remote controller communicate a control signal in a "1:1" relationship, and the remote controller remote-controls the controlled apparatus. Thus, the user performs an operation of directing the remote controller toward the controlled apparatus; and the natural and simple operation of the user who is intuitively aware of the one desired controlled apparatus allows the controlled apparatus to be remote-controlled. However, in the so-called network remote controller, i.e. the control apparatus for remote control, in which a plurality of types of electronic devices is connected to a communication line such as a network complying with a predetermined LAN (Local Area Network) standard and a predetermined wireless LAN standard; the plurality of electronic devices on the network can be operated by remote control, whereas it is technically hard to remote-control the controlled apparatus by the natural and simple operation of the user who is intuitively aware of the one desired controlled apparatus. This is because various processes are not performed, which associate (i) a plurality of electronic devices logically defined by the communication protocol on the network and (ii) a plurality of electronic devices disposed in the actual space.

In contrast, in the remote control system 1 in the example, as shown in FIG. 6, it is judged on the remote control apparatus 200 that the user has started the operation, by the user holding the remote control apparatus 200 (the step S30).

Then, the user fixes one's eyes on the controlled apparatus 100 (the step S50).

Then, on the controlled apparatus 100, the enable signal 110 is transmitted to the network by the communicating device 102 under the integrated control of the CPU 105; wherein the enable signal is to enable or allow the remote control with respect to the controlled apparatus 100. The enable signal includes the first identification information which can uniquely identify the controlled apparatus 100, such as an IP address of the controlled apparatus (the step S70).

Then, on the remote control apparatus 200, the aforementioned enable signal 110 is received under the integrated control of the CPU 206 (the step S80).

Then, the remote control apparatus 200 moves (or transits) into the remote controllable state in which the controlled apparatus 100 can be remote-controlled, under the integrated control of the CPU 206. The controlled apparatus 100 is uniquely identified by the first identification information included in the aforementioned enable signal (the step S90).

As described above, according to the example, the one controlled apparatus 100 that is desired by the user as a remote-control target, is specified from the plurality of controlled apparatuses by a specifying device such as the fixation point detecting device for detecting the user's fixation point. Then, the one controlled apparatus 100 is remote-controlled by the remote control apparatus 200 on the basis of the first identification information for identifying the specified one controlled apparatus 100.

Therefore, it is possible to automatically match (i) the one controlled apparatus 100 that is desired by the user as a control target or operation target and (ii) the one controlled apparatus 100 that can be controlled by the remote control apparatus 200 (in other words, one controlled apparatus that has an established communication line for transmitting and receiving the control signal with the remote control apparatus 200). As a result, it is possible to almost or completely eliminate the necessity to perform a complicated manual operation of selecting the one controlled apparatus 100 that is desired by the user as a control target or operation target, from the plurality of identification information such as a name and a manufacturing number in order to match (i) the one controlled apparatus that the user desires to control and (ii) the one controlled apparatus 100 that has the established communication line for transmitting and receiving the control signal with the remote control apparatus 200. The plurality of identification information indicates respective one of the plurality of controlled apparatuses such as a list of electronic devices displayed on the operation screen of the remote control apparatus 200.

Consequently, since (i) the one controlled apparatus 100 that the user desires to control and (ii) the one controlled apparatus that can be controlled by the remote control apparatus 200, are automatically matched; the user can control and operate each of the plurality of controlled apparatuses 100, mentally comfortably or easily, and it is possible to remarkably improve the convenience of the operations with respect to the plurality of controlled apparatuses 100 through the remote control apparatus 200 by the user.

In addition, electronic devices having various functions, such as an air conditioner, a television, and a recording apparatus like a DVD recorder, are connected on the network. The systems of the communication protocols for the operating methods properly corresponding to the electronic devices and operating the electronic devices, are different from each other.

In the example, if (i) the one controlled apparatus 100 that is desired by the user as a control target or operation target and (ii) the one controlled apparatus that has the established communication line for transmitting and receiving the control signal with the remote control apparatus 200, are automatically matched; the remote control apparatus 200 moves into an exclusive operation mode for operating the desired one controlled apparatus 100. The exclusive operation mode means an operation interface optimum to operate or change the function of the desired one controlled apparatus 100. As a result, the user can operate each electronic device, properly and accurately, by using the operation interface optimum to each electronic device, after the automatic matching.

(4) Second Embodiment of Remote Control System

Next, with reference to FIG. 7 to FIG. 9, an explanation will be given on a second example of the remote control system of the present invention. Incidentally, in the second example, substantially the same constituents and processes as those of the aforementioned example, will carry the same referential numerals and the same terms, and the explanation thereof will be omitted.

(4-1) Basic Structure

Firstly, with reference to FIG. 7, an explanation will be given on the basic structure of a remote control system 1 in the second example. FIG. 7 is a block diagram showing the basic structure of the remote control system 1 in a second example.

As shown in FIG. 1 described above, the remote control system 1 in the second example, is provided with; a controlled apparatus 100, a controlled apparatus 100*a*, and a controlled apparatus 100*b*, such as a plurality of electronic devices; and a remote control apparatus 200 for remote-controlling the controlled apparatus.

Moreover, the controlled apparatus 100, which is one of the plurality of controlled apparatus, is provided with; a fixation point detecting device 101 which can detect a fixation point on which a user's eyes are fixed; a face detecting device 103 for detecting whether or not the user's face is directed; a communicating device 102 which can connect to a network complying with, for example, a predetermined LAN standard; an infrared communicating device 104 which can communicate in an infrared method; and a CPU 105 for integrally controlling the controlled apparatus 100, as shown in FIG. 7. Moreover, the remote control apparatus 200 is provided with; a communicating device 201 which can connect to the network complying with, for example, an Ethernet standard or the like; an operation start button 202 for detecting the start of an operation by the user; an acceleration sensor 203 for detecting whether or not the user holds the remote control apparatus, from a change in acceleration; a fixation point detecting device 204 which can detect a fixation point on which the user's eyes are fixed; an infrared communicating device 205 which can communicate in the infrared method; and a CPU 206 for integrally controlling the controlled apparatus 100.

(4-2) Operation Principle

Next, with reference to FIG. 8 and FIG. 9, an explanation will be given on the operation principle of the remote control system 1 in the second example. FIG. 8 are a flowchart showing a flow of a communication process in which the controlled apparatus is focused on (FIG. 8(*a*)) and a flowchart showing a flow of a communication process in which the remote control apparatus is focused on (FIG. 8(*b*)), in the remote control system 1 in the second example.

(4-2-1) Operation Principle—Communication Processes of Controlled Apparatus

As shown in FIG. 8(*a*), on the controlled apparatus 100 in the remote control system 1 in the example, firstly, various communication processes for connecting to the network, are performed as an initial state, under the integrated control of the CPU 105 (step S110).

Then, it is judged whether or not a request signal is received by the communicating device 102 under the integrated control of the CPU 105, wherein the request signal indicates that the user holds the remote control apparatus 200 and the request signal is to request permission for the control apparatus to control one controlled apparatus (step S111). Here, if it is judged that the request signal is received (the step S111: Yes), second identification information is obtained under the integrated control of the CPU 105; wherein the second identification information is included in the request signal, the second identification information can uniquely identify the remote control apparatus 200, and the second identification information can be such as an IP address of the remote control apparatus 200 (step S112).

Then, a detecting process of detecting a fixation point on which the user's eyes are fixed, is performed by the fixation point detecting device 101 under the integrated control of the CPU 105 (step S113). In particular, the one controlled apparatus 100 desired by the user, may be specified by detecting that the user directs one's face toward the controlled apparatus 100, through the face detecting device 103, in addition to or instead of the fixation point detecting device 101, under the integrated control of the CPU 105.

Then, it is judged whether or not the fixation point on which the user's eyes are fixed, is detected, by the fixation point detecting device 101, within a predetermined time after the reception of the request signal, under the integrated control of the CPU 105 (step S120). Here, the "predetermined time" in the example, means, for example, a preset time interval until the detection of the fixation point after the reception of the request signal. For the predetermined time, a desired value may be adopted by experiments, theories, experiences, or simulations or the like; such that the controlled apparatus desired by the user, is clearly determined by the detection of the fixation point after the reception of the request signal. Here, if it is judged that the fixation point on which the user's eyes, are fixed is detected within the predetermined time, after the reception of the request signal (the step S120: Yes), an enable signal is transmitted to the network by the communicating device 102 under the integrated control of the CPU 105; wherein the enable signal is to enable or allow remote control with respect to the controlled apparatus 100, the enable signal includes the first identification information which can uniquely identify the controlled apparatus 100 and which can be such as an IP (Internet Protocol) address of the controlled apparatus (step S130). Then, the operational flow returns to the aforementioned step S110.

On the other hand, as a result of the step S120, if it is not judged that the fixation point on which the user's eyes are fixed, is detected within the predetermined time after the reception of the request signal (the step S120: No), as described above, the detecting process of detecting the fixation point on which the user's eyes are fixed, is performed by the fixation point detecting device 101, under the integrated control of the CPU 105 (the step S113). Alternatively, as a result of the step S120, if it is not judged that the fixation point on which the user's eyes are fixed, is detected within the predetermined time, after the reception of the request signal (the step S120: No), as described above, various communication processes for connecting to the network, may be performed as the initial state, under the integrated control of the CPU 105 (the step S110).

(4-2-2) Operation Principle—Communication Processes of Remote Control Apparatus

As shown in FIG. 8(*b*), on the remote control apparatus 200 in the remote control system 1 in the second example, firstly, various communication processes for connecting to the network are performed as an initial state, under the integrated control of the CPU 206 (step S210).

Then, it is judged whether or not the user has started an operation, by detecting the user's pressing down the operation start button 202, under the integrated control of the CPU 206 (step S220). In particular, it may be judged whether or not the user has started the operation by detecting the user's holding up the remote control apparatus 200 or a similar action, through the acceleration sensor 203 in addition to or instead of the operation start button 202, under the integrated control of the CPU 206. Alternatively, it may be judged whether or not the user has started the operation by detecting the user's turning one's eyes on the remote controller, through the fixation point detecting device 204 in addition to or instead of the operation start button 202, under the integrated control of the CPU 206.

Here, if the user's pressing down the operation start button 202, is detected, and it is judged that the user has started the operation (the step S220: Yes), a request signal is transmitted by the communicating device 201 under the integrated control of the CPU 206, wherein the request signal indicates that the user holds the remote control apparatus 200 and the request signal is to request permission for the control apparatus to control one controlled apparatus (step S225).

Then, the remote control apparatus 200 moves into a standby state in which the remote control apparatus 200 waits for the reception of the enable signal described above, under the integrated control of the CPU 206 (step S230).

Then, it is judged whether or not the aforementioned enable signal is received within a second predetermined time after the transmission of the request signal, under the integrated control of the CPU 206 (step S240). Here, the "second predetermined time" in the example means, for example, a preset time interval until the reception of the enable signal, after the transmission of the request signal. For the second predetermined time, a desired value may be adopted by experiments, theories, experiences, or simulations or the like, such that the permission for the remote control apparatus 200 to remote-control the controlled apparatus, is clarified by the controlled apparatus due to the reception of the enable signal, after the transmission of the request signal. Here, if it is judged that the aforementioned enable signal is received (the step S240: Yes), the remote control apparatus 200 moves into a remote controllable state in which the controlled apparatus 100 uniquely identified by the first identification information included in the aforementioned enable signal, can be remote-controlled, under the integrated control of the CPU 206 (step S250).

On the other hand, as a result of the judgment in the step S240, if it is not judged that the aforementioned enable signal is received within the second predetermined time after the transmission of the request signal (the step S240: No), as described above, the remote control apparatus 200 moves into the standby state in which the remote control apparatus 200 waits for the reception of the enable signal described above, under the integrated control of the CPU 206 (the step S230). Alternatively, as a result of the judgment in the step S240, if it is not judged that the aforementioned enable signal is received within the second predetermined time after the transmission of the request signal (the step S240: No), as described above, various communication processes for connecting to the network, are performed as the initial state, under the integrated control of the CPU 206 (the step S210).

(4-2-3) Operation Principle—Timing of All Operations

Next, with reference to FIG. 9, an explanation will be given on a series of timings of a user's operation, an operation of the controlled apparatus, and an operation of the remote control apparatus, in the remote control system 1 in the second example. FIG. 9 is a timing chart showing a series of timings of the user's operation, the operation of the controlled apparatus, the operation of the remote control apparatus, in the remote control system 1 in the second example.

As shown in FIG. 9, on the controlled apparatus 100 in the remote control system 1 in the second example, firstly, various communication processes for connecting to the network, are performed as an initial state, under the integrated control of the CPU 105 (step S10). Simultaneously with or in tandem with this, on the remote control apparatus 200, various communication processes for connecting to the network are performed as an initial state, under the integrated control of the CPU 206 (step S20).

Then, it is judged that the user has started the operation, on the remote control apparatus 200, for example, by detecting the user's pressing down the operation start button 202 (step S30).

Then, a request signal is transmitted in the remote control apparatus 200, under the integrated control of the CPU 206, wherein the request signal includes the second identification information which can uniquely identify the remote control apparatus 200 and which can be such as the IP address of the remote control apparatus 20 (step S35).

Then, the remote control apparatus 200 moves into the standby state in which the remote control apparatus 200 waits for the reception of the enable signal 110 described above, under the integrated control of the CPU 206 (step S40).

Then, the user fixes one's eyes on the controlled apparatus 100 (step S50).

Then, the controlled apparatus 100 detects that the controlled apparatus 100 itself is requested to be remote-controlled, under the integrated control of the CPU 206 (step S80). Specifically, when the user turns one's eyes on the controlled apparatus 100, the fixation point detecting device 101 detects that.

Then, on the controlled apparatus 100, the enable signal is transmitted to the remote control apparatus 200, which is identified by the second identification information on the network, by the communicating device 102 under the integrated control of the CPU 105, wherein the enable signal is to enable or allow the remote control with respect to the controlled apparatus 100, the enable signal includes the first, identification information which can uniquely identify the controlled apparatus 100 and which can be such as an IP address of the controlled apparatus (step S70). Specifically, the enable signal 110 including the IP address, which can identify the self-equipment (i.e., the controlled apparatus 100), i.e. a unique identifier, is transmitted onto the network through the communicating device 102 in a unicast method.

Then, on the remote control apparatus 200, the aforementioned enable signal is received under the integrated control of the CPU 206 (step S80). Specifically, the remote control apparatus 200 receives the enable signal by using the communicating device 201.

Then, the remote control apparatus 200 moves (or transits) into the remote controllable state in which the controlled apparatus 100 uniquely identified by the first identification information included in the aforementioned enable signal, can be remote-controlled, under the integrated control of the CPU 206 (step S90).

As described above, according to the second example, since the controlled apparatus 100 transmits the first identification information to the control apparatus specified by the received second identification information, the remote control apparatus 200 can remote-control the controlled apparatus 100, properly, highly accurately, and highly confidentially, on the basis of the transmitted first identification information.

In addition, since the remote control apparatus 200 remote-controls the controlled apparatus 100 on the basis of the first identification information and the enable signal, the remote control apparatus 200 can remote-control the controlled apparatus 100, more properly, more highly accurately and more highly confidentially.

In addition, the remote control apparatus 200 remote-controls the controlled apparatus 100, if the one controlled apparatus is specified within the predetermined time by the specifying device after the reception of the request signal. Thus, the remote control apparatus 200 can remote-control the controlled apparatus 100, more properly, more highly accurately and more highly confidentially, on the basis of the first identification information and the enable signal.

(5) Third Example of Remote Control System

Next, with reference to FIG. 10 and FIG. 11, an explanation will be given on a third example of the remote control system of the present invention. Incidentally, in the third example, substantially the same constituents and processes as those of the aforementioned example, will carry the same referential numerals and the same terms, and the explanation thereof will be omitted.

Next, with reference to FIG. 10 and FIG. 11, an explanation of an operation principal will be given on a third example of the remote control system of the present invention. Here FIG. 10 are a flowchart showing a flow of a communication process in which the controlled apparatus is focused on (FIG. 10(*a*)) and a flowchart showing a flow of a communication process in which the remote control apparatus is focused on (FIG. 10(*b*)), in the remote control system 1 in the third example.

(5-1) Operation Principle—Communication Processes of Controlled Apparatus

As shown in FIG. 10(*a*), on the controlled apparatus 100 in the remote control system 1 in the third example, firstly, various communication processes for connecting to the network are performed as an initial state, under the integrated control of the CPU 105 (step S110).

Then, it is judged whether or not a request signal is received by the infrared communicating device 104 under the integrated control of the CPU 105, wherein the request signal indicates that a user requests remote control through the remote control apparatus 200 (step S111*a*). Here, if it is judged that the request signal is received (the step S111*a*: Yes), second identification information is obtained under the integrated control of the CPU 105, wherein the second identification information is included in the request signal and the second identification information can uniquely identify the remote control apparatus 200 such as an IP address of the remote control apparatus 200 (step S112).

Then, an enable signal is transmitted to the remote control apparatus 200, which is uniquely identified by the second identification information on the network, by the infrared communicating device 104 under the integrated control of the CPU 105, wherein the enable signal is to enable or allow remote control with respect to the controlled apparatus 100 including first identification information which can uniquely identify the controlled apparatus 100, such as an IP address of the controlled apparatus (step S130). Then, the operational flow returns to the aforementioned step S110.

On the other hand, as a result of the step S111*a*, if it is not judged that the request signal is received by the infrared communicating device 104, wherein the request signal indicates that the user requests the remote control through the remote control apparatus 200 (the step S111*a*: No), as described above, various communication processes for connecting to the network may be performed as the initial state, under the integrated control of the CPU 105 (the step S110).

(5-2) Operation Principle—Communication Processes of Remote Control Apparatus

As shown in FIG. 10(*b*), on the remote control apparatus 200 in the remote control system 1 in the third example, firstly, various communication processes for connecting to the network are performed as an initial state, under the integrated control of the CPU 206 (step S210).

Then, it is judged whether or not the user has started an operation, by detecting the user's pressing down the operation start button 202, under the integrated control of the CPU 206 (step S220). Here, if the user's pressing down the operation start button 202 is detected, and it is judged that the user has started the operation (the step S220: Yes), a request signal is transmitted by the infrared communicating device 205 under the integrated control of the CPU 206, wherein the request signal indicates that the user requests the remote control through the remote control apparatus 200 (step S225*a*).

Then, the remote control apparatus 200 moves into a standby state in which the remote control apparatus 200 waits for the reception of the enable signal described above, under the integrated control of the CPU 206 (step S230).

Then, it is judged whether or not the aforementioned enable signal is received within the aforementioned second predetermined time after the transmission of the request signal, under the integrated control of the CPU 206 (step S240). Here, if it is judged that the aforementioned enable signal is received (the step S240: Yes), the remote control apparatus 200 moves into a remote controllable state in which the controlled apparatus 100 uniquely identified by the first identification information included in the aforementioned enable signal can be remote-controlled, under the integrated control of the CPU 206 (step S250).

On the other hand, as a result of the judgment in the step S240, if it is not judged that the aforementioned enable signal is received within the second predetermined time after the transmission of the request signal (the step S240: No), as described above, the remote control apparatus 200 moves into the standby state in which the remote control apparatus 200 waits for the reception of the enable signal described above, under the integrated control of the CPU 206 (the step S230). Alternatively, as a result of the judgment in the step S240, if it is not judged that the aforementioned enable signal is received within the second predetermined time after the transmission of the request signal (the step S240: No), as described above, various communication processes for connecting to the network are performed as the initial state, under the integrated control of the CPU 206 (the step S210).

(5-3) Operation Principle—Timing of All Operations

Next, with reference to FIG. 11, an explanation will be given on a series of timings of a user's operation, an operation of the controlled apparatus, and an operation of the remote control apparatus, in the remote control system 1 in the third example. FIG. 11 is a timing chart showing a series of timings of the user's operation, the operation of the controlled apparatus, the operation of the remote control apparatus, in the remote control system 1 in the third example.

As shown in FIG. 11, on the controlled apparatus 100 in the remote control system 1 in the third example, firstly, various communication processes for connecting to the network are performed as an initial state, under the integrated control of the CPU 105 (step S10). Simultaneously with or in tandem with this, on the remote control apparatus 200, various communication processes for connecting to the network are performed as an initial state, under the integrated control of the CPU 206 (step S20).

Then, it is judged that the user has started the operation, on the remote control apparatus 200, for example, by detecting the user's pressing down the operation start button 202 (step S30).

Then, a request signal is transmitted by the infrared communicating device 205 on the remote control apparatus 200 under the integrated control of the CPU 206, wherein the request signal includes the second identification information which can uniformly identify the remote control apparatus 200, such as the IP address of the remote control apparatus 200, and which indicates that the user requests the remote control through the remote control apparatus 200 (step S35*a*). Simultaneously with or in tandem with this, the remote control apparatus 200 moves into a standby state in which the remote control apparatus 200 waits for the reception of the enable signal 110 described above, under the integrated control of the CPU 206 (step S40).

Then, the controlled apparatus 100 detects that the controlled apparatus 100 itself is requested to be remote-controlled, simultaneously with or in tandem with the transmission of the request signal by the infrared communicating device 205 under the integrated control of the CPU 206 (step S60).

Then, on the controlled apparatus 100, the enable signal is transmitted to the remote control apparatus 200, which is identified by the second identification information on the network, by the infrared communicating device 104 under the integrated control of the CPU 105, wherein the enable signal is to enable or allow the remote control with respect to the controlled apparatus 100 including the first identification information which can uniquely identify the controlled apparatus 100, such as an IP address of the controlled apparatus (step S70). Specifically, the enable signal 110 including the IP address, which can identify the self-equipment (i.e., the controlled apparatus 100), i.e. a unique identifier, is transmitted through the communicating device 102.

Then, on the remote control apparatus 200, the aforementioned enable signal is received under the integrated control of the CPU 206 (step S80). Specifically, the remote control apparatus 200 receives the enable signal by using the communicating device 201.

Then, the remote control apparatus 200 moves (or transits) into the remote controllable state in which the controlled apparatus 100 uniquely identified by the first identification information included in the aforementioned enable signal can be remote-controlled, under the integrated control of the CPU 206 (step S90).

According to the third example, the remote control apparatus 200 can remote-control one controlled apparatus, properly, highly accurately and highly confidentially, on the basis of the low-cost communication method through infrared rays.

In the examples, an explanation was given on the remote control system provided with the plurality of controlled apparatuses such as a DVD recorder, a television, and an air conditioner; however, the present invention can be also applied to a remote control system provided with electronic devices for recording and reproducing video images and audio, for example, all types of electronic devices such as various network communication devices like routers and servers, electric household appliances, HDD (Hard Disc Drive) recorders, digital cameras, car navigations, PCs (Personal Computers) for TV (Television) recording, mobile phones, or game devices.

The present invention is not limited to the aforementioned examples, but various changes may be made, if desired, without departing from the essence or spirit of the invention which can be read from the claims and the entire specification. A remote control system and a method of controlling the remote control system, all of which involve such changes, are also intended to be within the technical scope of the present invention.

INDUSTRIAL APPLICABILITY

The remote control system and the method of controlling the remote control system of the present invention can be applied to a remote control system which can remote-control a plurality of controlled apparatuses.

The invention claimed is:

1. A remote control system comprising:

a plurality of controlled apparatuses;

a specifying device for specifying one controlled apparatus that is desired by a user as a remote control target, from said plurality of controlled apparatuses; and a control apparatus for remote-controlling the one controlled apparatus on the basis of first identification information which identifies the specified one controlled apparatus, said control apparatus comprising;

a first receiving device for receiving the first identification information;

a first transmitting device for transmitting second identification information which identifies said control apparatus;

a remote controlling device for identifying and remote-controlling the one controlled apparatus on the basis of the first identification information;

a judging device for judging whether or not the user holds said control apparatus;

a controlling device for controlling the first transmitting device to transmit the second identification information, if it is judged that the user holds said control apparatus;

a detecting device for detecting a fixation point on which the user's eyes are fixed with respect to said control apparatus, and the one controlled apparatus comprising;

a second receiving device for receiving the transmitted second identification information; and a second transmitting device for transmitting the first identification information to said control apparatus specified by the received second identification information, wherein the judging device judges whether or not the user holds said control apparatus, on the basis of the detected fixation point.

2. The remote control system according to claim 1, wherein said specifying device specifies the one controlled apparatus on the basis of whether or not the user's face can be detected; in addition to or instead of specifying the one controlled apparatus on the basis of a fixation point on which the user's eyes are fixed.

3. The remote control system according to claim 1, wherein the second transmitting device transmits the first identification information in addition to an enable signal for allowing said control apparatus to control the one controlled apparatus, after the one controlled apparatus is specified by said specifying device.

4. The remote control system according to claim 1, wherein the first transmitting device transmits the second identification information in addition to a request signal for requesting permission for said control apparatus to control the one controlled apparatus, and the second transmitting device transmits the first identification information in addition to an enable signal for allowing said control apparatus to control the one controlled apparatus, after the request signal is received by the second receiving device.

5. The remote control system according to claim 4, wherein the second transmitting device transmits the first identification information in addition to the enable signal; if the one controlled apparatus is specified within a predetermined time by the specifying device, after the request signal is received by the second receiving device.

6. The remote control system according to claim 1, wherein said control apparatus further comprises a second detecting device for detecting a change in kinetic energy on said control apparatus, and said judging device judges whether or not the user holds said control apparatus, on the basis of the detected change in kinetic energy.

7. The remote control system according to claim 1, wherein
the first receiving device receives the first identification information through infrared rays,
the first transmitting device transmits the second identification information through infrared rays,
the second receiving device receives the second identification information through infrared rays, and
the second transmitting device transmits the first identification information through infrared rays.

8. A remote control system comprising: a plurality of controlled apparatuses; and a control apparatus for remote-controlling said controlled apparatuses,
said plurality of controlled apparatuses comprising:
a first detecting device for detecting at least one of a user's eyes, the user's face direction, and infrared irradiation;
a specifying device for specifying one controlled apparatus that is desired by the user as a remote control target, on the basis of the detected at least one of the user's eyes, the user's face direction, and infrared irradiation;
a second receiving device for receiving second identification information which identifies said control apparatus; and
a second transmitting device for transmitting (i) an enable signal for allowing said control apparatus to control the one controlled apparatus, in addition to (ii) first identification information which identifies the specified one controlled apparatus, to said control apparatus identified by the received second identification information,
said control apparatus comprising:
a first receiving device for receiving the first identification information;
a first transmitting device for transmitting the second identification information; and
a remote controlling device for identifying and remote-controlling the one controlled apparatus on the basis of the first identification information.

9. A method of controlling a remote control system comprising a plurality of controlled apparatuses and a control apparatus which can remote-control each of said plurality of controlled apparatuses, said method comprising:
a specifying process of specifying one controlled apparatus that is desired by a user as a remote control target, from said plurality of controlled apparatuses; and
a remote controlling process of controlling said control apparatus to remote-control the one controlled apparatus, on the basis of first identification information which identifies the specified one controlled apparatus,
said remote controlling process comprising;
a first receiving process of receiving the first identification information;
a first transmitting process of transmitting second identification information which identifies said control apparatus;
a controlling process of identifying and remote-controlling the one controlled apparatus on the basis of the first identification information;
a judging process of judging whether or not the user holds said control apparatus;
a controlling process of controlling the first transmitting device to transmit the second identification information, if it is judged that the user holds said control apparatus;
a detecting process of detecting a fixation point on which the user's eyes are fixed with respect to said control apparatus;
a second receiving process in which the one controlled apparatus receives the transmitted second identification information;
a second transmitting process in which the one controlled apparatus transmits the first identification information to said control apparatus specified by the received second identification information,
wherein
the judging process judges whether or not the user holds said control apparatus, on the basis of the detected fixation point.

* * * * *